United States Patent [19]

Masuda et al.

[11] 3,798,433

[45] Mar. 19, 1974

[54] DECIMAL-TO-BINARY CODE CONVERSION CIRCUIT

[75] Inventors: Noboru Masuda, Kawaguchi Saitama; Masasi Kuroyanagi, Tokyo, both of Japan

[73] Assignee: Denki Onkyo Co., Ltd., Tokyo, Japan

[22] Filed: Mar. 22, 1972

[21] Appl. No.: 236,844

[30] Foreign Application Priority Data

Mar. 23, 1971 Japan .............................. 46-16664
Dec. 27, 1971 Japan .............................. 46-1951

[52] U.S. Cl. .......................... 235/155, 340/347 DD
[51] Int. Cl. .......................................... H03k 13/02
[58] Field of Search 235/155; 340/347 DD, 347 CC; 178/26 R; 307/206

[56] References Cited

UNITED STATES PATENTS

| | | | |
|---|---|---|---|
| 3,601,626 | 8/1971 | Hoffmann et al. | 340/347 DD |
| 3,653,034 | 3/1972 | Regitz | 340/347 DD |
| 3,308,236 | 3/1967 | Jones, Jr. | 178/26 R |
| 3,638,218 | 1/1972 | Kaneko et al. | 340/347 CC |

*Primary Examiner*—Thomas A. Robinson
*Attorney, Agent, or Firm*—Armstrong & Wegner

[57] ABSTRACT

A decimal-to-binary code conversion circuit (hereafter referred to as the "conversion circuit") comprised of switching circuits which perform switching in accordance with variation of the resistance value of electrically contactless type variable resistance devices and binary circuits which generate code signals in response to the operation of said switching circuits, wherein these two types of circuits are connected in different combinations.

15 Claims, 17 Drawing Figures

DECIMAL-TO-BINARY CODE CONVERSION CIRCUIT

BACKGROUND OF THE INVENTION

The present invention relates to a decimal-to-binary code conversion circuit which employs electrically contactless type variable resistance devices (hereafter referred to as the "device") to convert decimal code into binary code.

Recently, it has been suggested to employ the so-called contactless switch utilizing the device such as, for example, a magneto-resistance effect device or a photoelectric device in peripheral units of a computer or a keyboard of a computer such as a desk type computer.

The switching circuit employing this contactless switch employs, for example, the device as the bias resistor of the switching element and operates with variation of the resistance value of the switching element.

However, since the device generally greatly depends on the temperature, the conventional switching circuit employing the device is disadvantageous because the range of the temperature applied is limited. The switching circuit as described above requires a compensating circuit which compensates the switching operation although this is not performed instantaneously.

Furthermore, the conventional circuit is disadvantageous in that the circuit construction is complicated because it is necessary to connect an encoder consisting of a diode matrix to said switching circuit and to connect a chatter preventing circuit and a switching operation compensation circuit to the switching circuit corresponding to each decimal code, in order to convert decimal codes into binary codes.

The present invention provides the conversion circuit which is simple in construction and is compensated with respect to temperature.

SUMMARY

A decimal-to-binary code conversion circuit, wherein an electrically contactless type variable resistance device such as, for example, a magneto-resistance effect device whose resistance value varies in accordance with the intensity of the magnetic field applied to the device, a photoelectric resistance effect device whose resistance value varies in accordance with the radiation quantity of light applied to the device or a pressure sensitive device whose resistance value varies in accordance with pressure, is employed as a bias resistor for the switching element, for exampl,e a transistor the bias potential varies in accordance with the variation of the resistance value of the device when a contactless switch which is arranged to vary the resistance value of said device is operated. A plurality of switching circuits are provided of which the collector voltage, that is, the output voltage varies when the switching element, for example, transistor is turned on or off; a plurality of binary conversion circuits together with said switching circuits form a modified Schmitt circuit so that it performs the switching operation to generate the binary coded signals according to the variation of the output voltage of said switching circuit. Said switching circuits are provided in a number equal to or less than the maximum number of different combinations of said binary conversion circuits and in a number more than the maximum number of different combinations of said binary conversion circuits in a number one less than the number of said binary conversion circuits. Some of said binary conversion circuits are parallel-connected to the output side of said switching circuits and each binary conversion circuit is connected to some of said switching circuits. The the binary conversion circuits are connected to said switching circuits in different combinations; and different binary coded signals are supplied to the logic circuit according to the operation of said switching elements.

BRIEF DESCRIPTION OF THE DRAWINGS

The present invention is illustrated in detail by the accompanying drawings whereon.

DETAILED DESCRIPTION OF THE INVENTION

Figure 1:
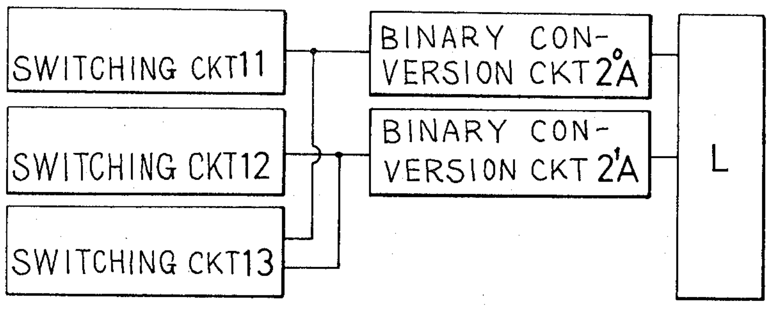
FIG. 1 shows the basic connection of a conversion circuit according to the present invention.

Referring to FIG. 1, there is shown a circuit diagram illustrating the basic principle in the event that a conversion circuit according to the present invention is simplest in construction, that is, three decimal codes are converted into two-bit binary codes.

Logic circuit L is connected to two binary conversion circuits $2^0$A and $2^1$A as the input signal source; binary conversion circuit $2^0$A generates $2^0$ code signal and binary conversion circuit $2^1$A generates $2^1$ code signal.

The input side of said binary conversion circuit $2^0$A is connected to each output side of switching circuits 11 and 13 and the input side of binary conversion circuit $2^1$A to each output side of switching circuits 12 and 13. Said switching circuits are arranged to contain the devices of the contactless switches corresponding to the values of decimal codes and operate with variation of the resistance value of the devices when these contactless switches are operated and the binary conversion circuits connected to said switching circuits are operated. For example, switching circuit 11 operates when the contactless switch corresponding to numeral 1 is operated, to cause binary conversion circuit $2^0$A to operate. Switching circuit 12 operates when the contactless switch corresponding to numeral 2 is operated, to cause binary conversion circuit $2^1$A to operate. Switching circuit 13 operates when the contactless switch corresponding to numeral 3 is operated, to cause binary conversion circuits $2^0$A and $2^1$A to operate.

Figure 2:
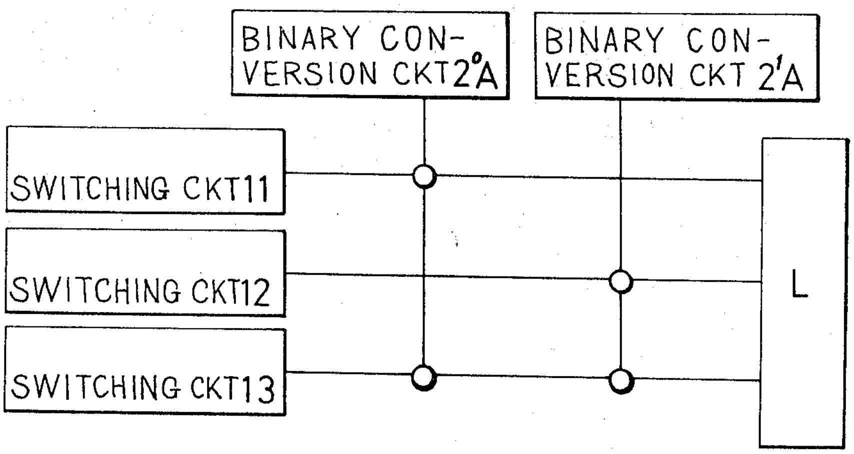
FIG. 2 shows the basic principle of a conversion circuit according to the present invention.

The relationship of connections of the circuits is shown in FIG. 2 as an example. In FIG. 2, the intersections of horizontal lines and vertical lines which are marked with circles show the connection of the switching circuits corresponding to the numbers entered on the horizontal lines and the binary conversion circuits corresponding to the numbers entered on the vertical lines. For example, binary conversion circuit $2^1$A is connected to switching circuits 12 and 13 and binary conversion circuit $2^0$A to switching circuits 11 and 13.

The binary conversion circuits connected to the switching circuits are arranged in different combinations.

The devices such as, for example, a magneto-resistance effect device, having a magneto-sensitive resistance device whose internal resistance value varies with the effect of magnetic field, a pressure-sensitive device made of a semiconductor or a conductive rubber whose resistance value varies with variation of the pressure or a semiconductor photoelectric resistance effect device whose resistance value varies with variation of the radiation quantity of light, can be employed.

Figure 3:
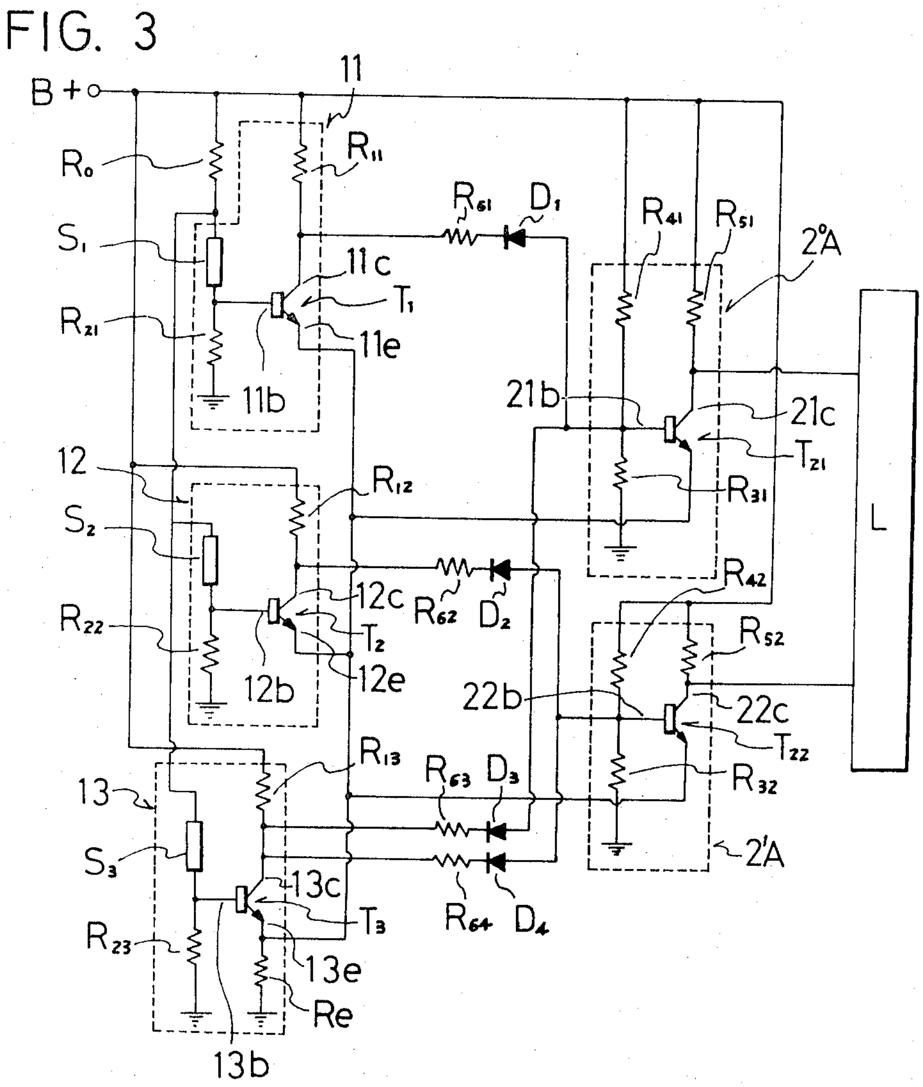
FIG. 3 is a connection diagram illustrating the basic circuit according to the present invention.

Referring to FIG. 3, there is shown an actual circuit arrangement of the basic circuit illustrated in FIG. 1.

Switching circuits 11, 12 and 13 have transistors $T_1$, $T_2$ and $T_3$ as the switching elements and devices $S_1$, $S_2$ and $S_3$ as the bias resistors for these transistors. Collectors 11C, 12C and 13C of transistors $T_1$, $T_2$ and $T_3$ are connected respectively to fixed voltage supply terminal B+ through collector load resistors $R_{11}$, $R_{12}$ and $R_{13}$ and bases 11*b*, 12*b* and 13*b* of transistors $T_1$, $T_2$ and $T_3$ are grounded respectively through fixed bias resistors $R_{21}$, $R_{22}$ and $R_{23}$ and are connected to said fixed voltage supply terminal B+ through common current limiting resistor Ro and devices $S_1$, $S_2$ and $S_3$. Accordingly, the operating potential to said transistors is set by fixed bias resistors $R_{21}$, $R_{22}$ and $R_{23}$ and devices $S_1$, $S_2$ and $S_3$.

On the other hand, the grounding poles of transistors $T_1$, $T_2$ and $T_3$, that is, emitters 11*e*, 12*e* and 13*e* shown in an embodiment in FIG. 3 are parallel-connected and grounded through a common grounding resistor, that is emitter resistor Re.

Binary conversion circuits $2^0$A and $2^1$A contain transistors $T_{21}$ and $T_{22}$ as the operating elements. Bases 21*b* and 22*b* are respectively grounded through bias resistors $R_{31}$ and $R_{32}$ and connected to fixed voltage supply terminal B+ through bias resistors $R_{41}$ and $R_{42}$, and collectors 21C and 22C of transistors $T_{21}$ and $T_{22}$ are respectively connected to fixed voltage supply terminal B+ through collector load resistors $R_{51}$ and $R_{52}$.

The emitters of the transistors of said switching circuits 11, 12, and 13 and the emitters of the transistors of binary conversion circuits $2^0$A and $2^1$A are connected in parallel and grounded through common emitter resistor Re. Collector 11C of switching circuit 11 is connected to base 21*b* of binary conversion circuit $2^0$A through the series circuit consisting of resistor $R_{61}$ and diode $D_1$, collector 12C of switching circuit 12 is connected to base 22*b* of binary conversion circuit $2^1$A through the series circuit consisting of resistor $R_{62}$ and diode $D_2$, and collector 13C of switching circuit 13 is connected to base 21*b* of binary conversion circuit $2^0$A through the series circuit consisting of resistor $R_{63}$ and diode $D_3$ and to base 22*b* of binary conversion circuit $2^1$A through the series circuit consisting of resistor $R_{64}$ and diode $D_4$. These diodes are connected in a direction from said binary conversion circuits to said switching circuits.

With the connection described above, switching circuits 11, 12 and 13 and binary conversion circuits $2^0$A and $2^1$A form a modified Schmitt circuit in the connection arrangement shown in FIG. 1. Furthermore, collectors 21C and 22C of said each binary conversion circuit are connected so as to give the output signal to logic circuit L.

Figure 4:
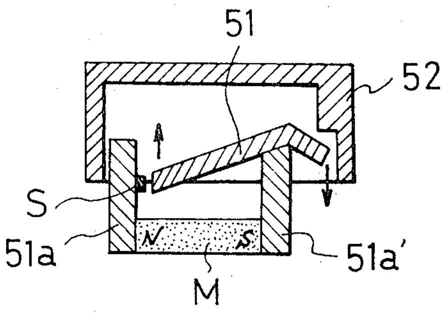
FIG. 4 is a cross sectional view of a switch comprised of the devices to be employed in a circuit according to the present invention.

In the circuit, described above, devices $S_1$, $S_2$ and $S_3$ maintain high resistance usually and the device corresponding to a desired decimal code selectively varies its resistance value to a low value; for example, when the magneto-resistance effect device is employed as said device, the devices can form an apparatus shown in FIG. 4. The apparatus is constructed so that fixed magnetic pieces 51*a* and 51*a'* made of, for example, pure iron are fixed at both sides of permanent magnet M, moving magnetic piece 51 is provided to oppose one magnetic piece 51*a* and to come in contact with other magnetic piece 51*a'*. Magneto-resistance effect device S is provided between fixed magnetic piece 51*a* and moving magnetic piece 51, the magnetic flux usually concentrates onto said device and the magnetic flux concentrating onto the device is eliminated by shifting said moving magnetic piece in a arrow-indicated direction to reduce the resistance value of the device. Accordingly, this apparatus is such that a push button switch mechanism can be formed by mounting push button cap 52 onto moving magnetic piece 51.

Thus, the bias potential of the transistor of the switching circuit varies with variation of the resistance value of the device. Accordingly, if the magneto-resistance effect device is employed as the device, transistors, $T_1$, $T_2$ and $T_3$ are not conducting when the magnetic field concentrates on the device and only the transistors connected to the device are conducting when the magnetic field is selectively removed, thus disconnecting the transistors of the binary conversion circuits connected to the collector of said transistor.

The following describes the operation of this circuit.

Transistors $T_1$, $T_2$ and $T_3$ of switching circuits 11, 12 and 13 are not conducting because the base potential of transistors $T_1$, $T_2$ and $T_3$ is low when the contactless switch for varying the resistance value of the devices contained in the circuits is not depressed, that is, when the resistance value of the devices is high, for example, when the magnetic field is concentrated onto the devices, assuming that the magneto-resistance effect device is employed as said device.

Under this condition, a high voltage is applied to collectors 11C, 12C and 13C but does not affect the bias potential of transistors $T_{21}$ and $T_{22}$ since diodes $D_1$, $D_2$, $D_3$ and $D_4$ are provided between said collectors and bases 21*b* and 22*b* of transistors $T_{21}$ and $T_{22}$ of binary conversion circuits $2^0$A and $2^1$A. On the other hand, the bias potential of transistors $T_{21}$ and $T_{22}$ is set so that the transistors conduct by the current flowing from fixed voltage supply terminal B+ to bias resistors $R_{41}$ and $R_{31}$ and bias resistors $R_{42}$ and $R_{32}$ and thus the output voltage from collectors 21c and 22C is extremely low.

When the contactless switch is selectively depressed, for example, the switch for switching circuit 11 is depressed, the resistance value of device $S_1$ decreases, the bias voltage of transistor $T_1$ rises and transistor $T_1$ conducts. If the magneto-resistance effect device is, for example, employed as said device, transistor $T_1$ conducts when the magnetic field concentrated onto the magneto-resistance effect device is removed.

Under this condition, since the potential of collector 11C of transistor $T_1$ lowers, almost all of the bias current of transistor $T_{21}$ flows in diode $D_1$ and flows into emitter resistor Re through transistor $T_1$. Accordingly, since the bias voltage of transistor $T_{21}$ drops, transistor $T_{21}$ is nonconducting. In this case, the output voltage from collector 21C becomes large. This output voltage is the code signal of $2^0$.

Similarly, when the switch of switching circuit 12 is depressed, transistor $T_2$ of switching circuit 12 conducts and transistor $T_{22}$ of binary conversion circuit $2^1$A is nonconducting, thus generating $2^1$ code signals. Furthermore, when the switch of switching circuit 13 is depressed, transistor $T_3$ of switching circuit 13 conducts and transistor $T_{21}$ of binary conversion circuit $2^0$A and transistor $T_{22}$ of binary conversion circuit $2^1$A is nonconducting, thus generating code signals of $2^0$ and $2^1$.

Figure 5:
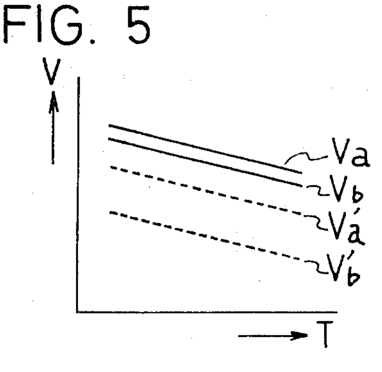
FIG. 5 is a graph illustrating the switching characteristics of a circuit according to the present invention.

As described above, a circuit according to the present invention is comprised of a modified Schmitt circuit and the relationship between operation potential V and temperature T in switching operation is as shown in FIG. 5. The potential difference between operation starting voltage V*a* and operation stopping voltage V*b* is smaller than that between operation starting voltage V*a'* and operation stopping voltage V*b'* in the switching operation of a single transistor. Accordingly, the modified Schmitt circuit performs, the switching operation with smaller voltage variation than the switching operation of a single transistor. If the same potential difference is applied to both the modified Schmitt circuit and a single transistor, the circuit comprised of a single transistor does not, in some cases, perform switching operation with a considerably large variation of the temperature. However, the circuit according to the present invention is advantageous in the point that it stably operates in a wide range of temperature because the modified Schmitt circuit is employed.

Figure 6:
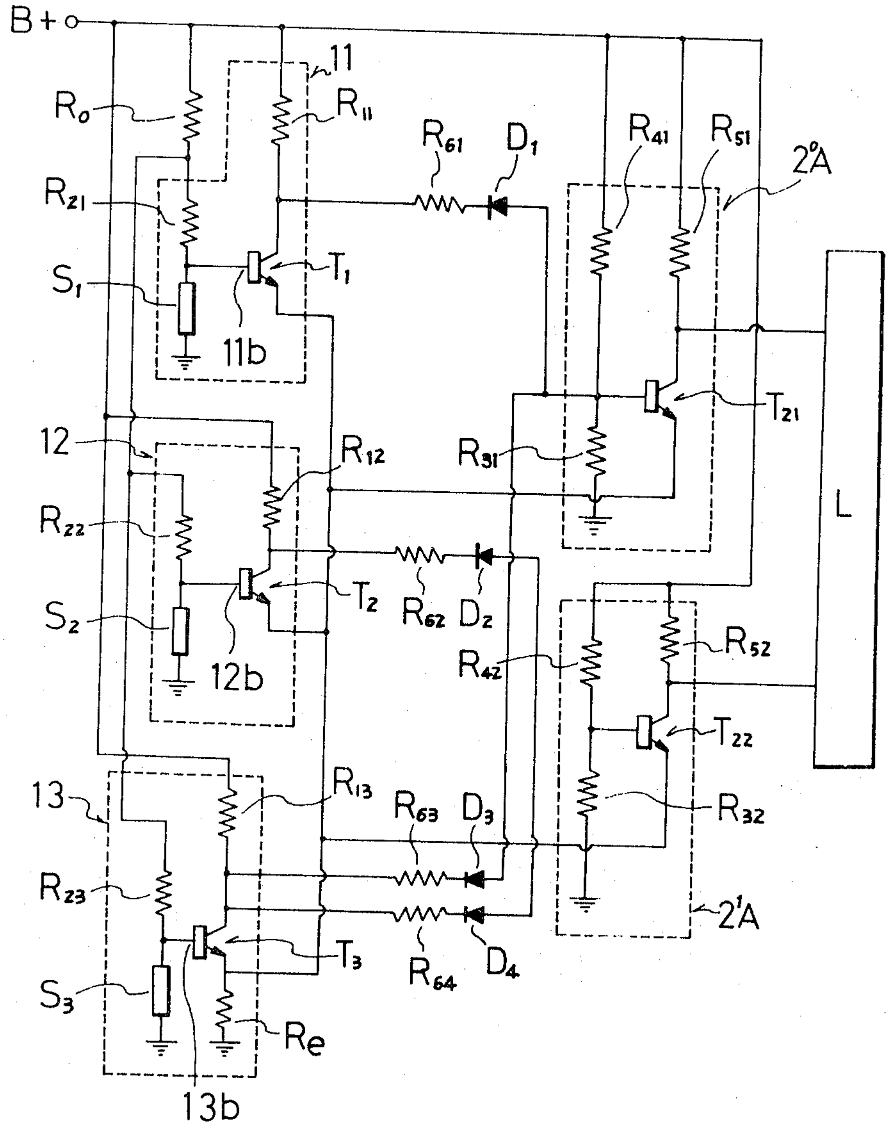
FIGS. 6 and 7 are circuit diagrams illustrating other embodiments of a circuit according to the present invention.

The circuit construction as described above is such that the resistance of the device is reduced when the contactless switch is depressed. On the contrary, the circuit can be arranged so that the resistance value of the device increases and the switching circuit operates. For example, as shown in FIG. 6, bias resistors $R_{21}$, $R_{22}$ and $R_{23}$ of switching circuits 11, 12 and 13 are respectively replaced with devices $S_1$, $S_2$ and $S_3$ and are connected. In these circuits, if the magneto-resistance effect device is employed as the device to form a contactless switch so that the magnetic field is concentrated onto the device and the resistance value of the device increases when the contactless switch is depressed, the resistance value of the device increases when the contactless switch in depressed and accordingly, the bias potential of transistors $T_1$, $T_2$ and $T_3$ rises and the transistors conduct, thus making it possible to generate the binary coded signals as the circuit shown in FIG. 3.

Moreover, the circuit can be arranged by setting switching circuits 11, 12 and 13 to operate and setting binary conversion circuits $2^0$A and $2^1$A not to operate while the contactless switches are not being depressed so that the transistors of the switching circuits are nonconducting and the switching circuits are selectively set not to operate when the contactless switch is selectively depressed and the resistance value varies and the binary conversion circuits connected to the switching circuits operates due to conduction of the transistors of the binary conversion circuits to generate binary coded signals.

Figure 7:
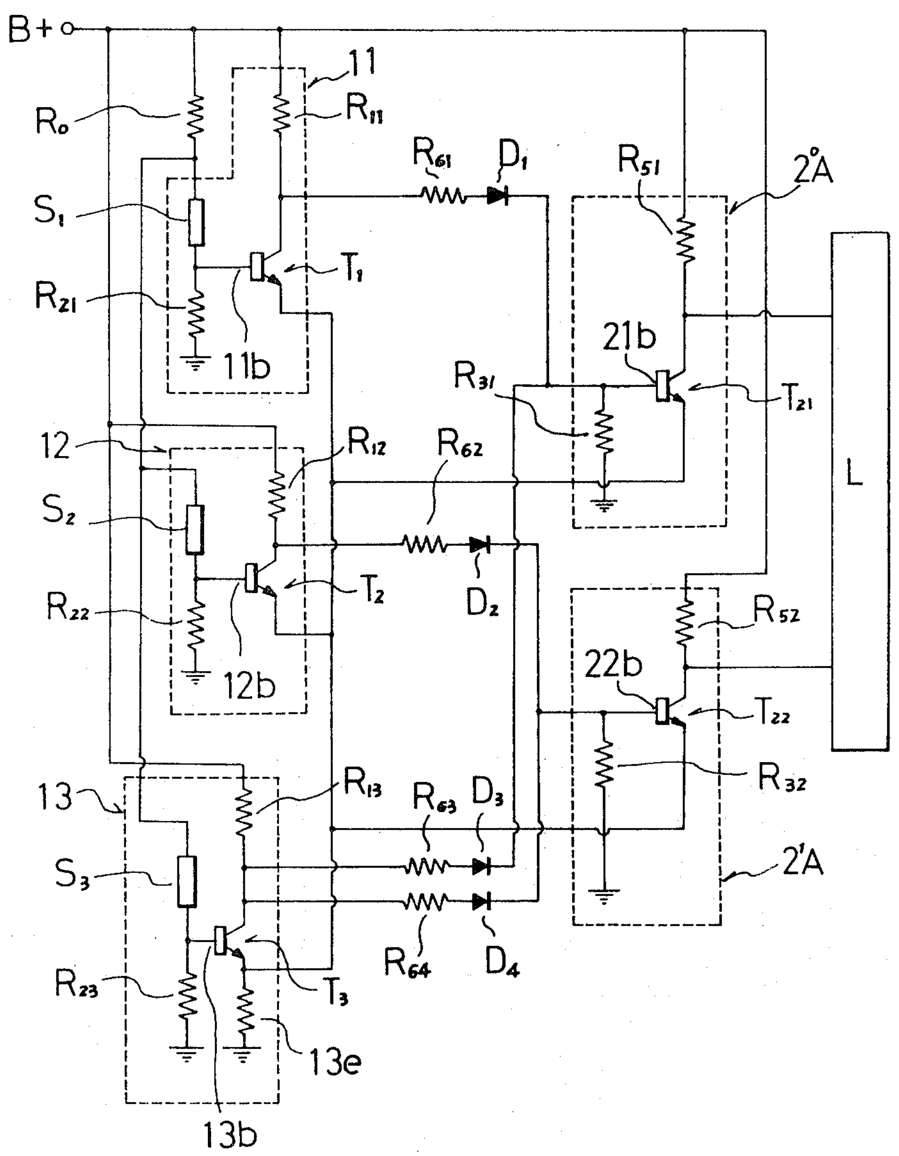

Referring to FIG. 7, there is shown a circuit according to the present invention which is arranged as described above.

This circuit is such that diodes $D_1$, $D_2$, $D_3$ and $D_4$ in the circuit shown in FIG. 3 are connected in a direction reverse to those in the circuit shown in FIG. 3, bases 21b and 22b of transistors $T_{21}$ and $T_{22}$ of binary conversion circuits $2^0$A and $2^1$A are disconnected from fixed voltage supply terminal B+ and bias resistors $R_{41}$ and $R_{42}$ are omitted.

In this circuit, the contactless switches are arranged so that the resistance value of the device increases when the contactless switch is depressed as shown in the embodiment described in the foregoing and the resistance value of devices $S_1$, $S_2$ and $S_3$ are set so that the bias potential of transistors $T_1$, $T_2$ and $T_3$ is held at a level in which transistors $T_1$, $T_2$ and $T_3$ are conducting if the contactless switches of switching circuits 11, 12 and 13 are not depressed.

Under this condition, since the potential of collectors 11C, 12C and 13C of transistors $T_1$, $T_2$ and $T_3$ is low, the potential across both ends of bias resistors $R_{31}$ and $R_{32}$ of binary conversion circuits $2^0$A and $2^1$A is extremely low and therefore transistors $T_{21}$ and $T_{22}$ of said binary conversion circuits are nonconducting.

On the other hand, if the switch is depressed and the resistance value of, for example, device $S_1$ of switching circuit 11 increases, the bias potential of transistor $T_1$, the transistor is nonconducting, the potential of collector 11C rises and the current from the power source flows in bias resistor $R_{31}$ through diode $D_1$. Therefore, the bias potential of transistor $T_{21}$ of binary conversion circuit $2^0$A rises and this transistor conducts. Accordingly, the output voltage lowers and $2^0$ code signal is generated.

Thus, in case of the circuit in the arrangement described above, the lowering of the output voltage results in generation of the binary coded signals.

The circuit according to the present invention is not restricted to the arrangement in which transistors are employed and can employ integrated circuits such as, for example, IC, LSI, etc.

Figure 8:
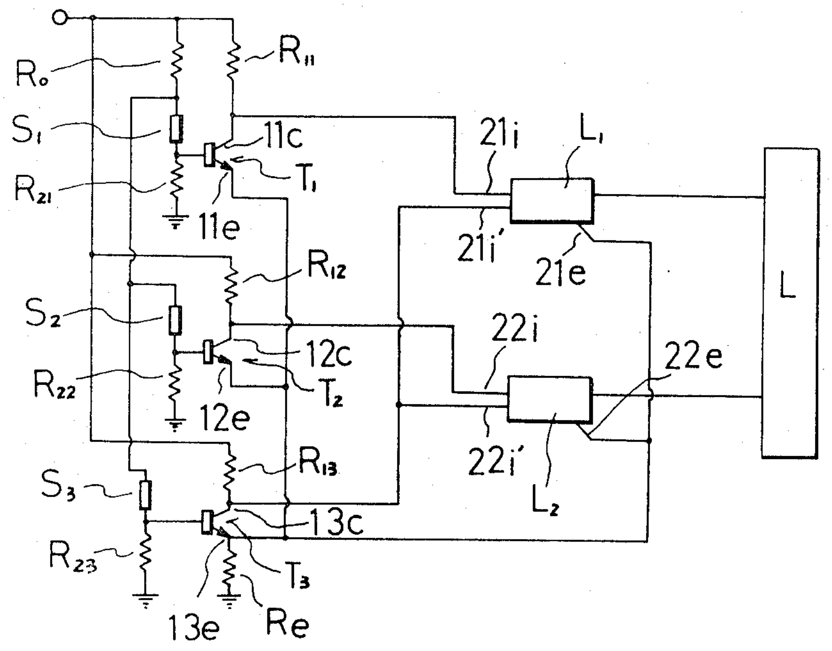
FIG. 8 is a circuit diagram illustrating another embodiment of a circuit according to the present invention.

Referring to FIG. 8, there is shown a circuit employing integrated logic devices $L_1$ and $L_2$ instead of diodes $D_1$, $D_2$, $D_3$ and $D_4$ and binary conversion circuits $2^0$A and $2^1$A employed in the embodiment shown in FIG. 3.

In this circuit, collectors 11C and 13C of transistor $T_1$ of switching circuit 11 and transistor $T_3$ of switching circuit 13 are respectively connected to input terminals 21*i* and 21' of logic device $1_1$, collectors 12C and 13C of transistor $T_2$ of switching circuit 12 and transistor $T_3$ of switching circuit 13 are respectively connected to input terminal 22*i* and 22*i'* of logic device $L_2$, and emitters 21*e* and 22*e* of logic devices $L_1$ and $L_2$ are parallel-connected to emitters 11*e*, 12*e* and 13*e* of transistors $T_1$, $T_2$ and $T_3$ and are grounded through emitter resistor Re.

In this case, if a switching circuit is designed so that the resistance value of the device is normally large as shown with respect to the circuit of the embodiment in FIG. 3 and decreases when the switch is selectively depressed, to turn on the transistors of the switching circuits, said logic devices $L_1$ and $L_2$ can be a NAND circuit as the output potential rises when the potential applied to at least one of a pair of input terminals drops.

As shown in the circuit of the embodiment in FIG. 7, if the switching circuit is designed so that the resistance value of the device is usually small and increases when the switch is selectively depressed, to turn off the transistors of the switching circuit and raise the potential of the collectors of the transistors rises, said logic devices $L_1$ and $L_2$ can be a NOR circuit as the output potential drops when the potential applied to at least one of a pair of input terminals rises.

Thus, the circuit arrangement can be small by employing the integrated circuits as described above.

The circuit arrangement described above shows the basic arrangement in which the least number of binary conversion circuits are employed. The circuit according to the present invention can convert a plurality of decimal codes into binary coded signals by providing further binary conversion circuits.

Figure 9:
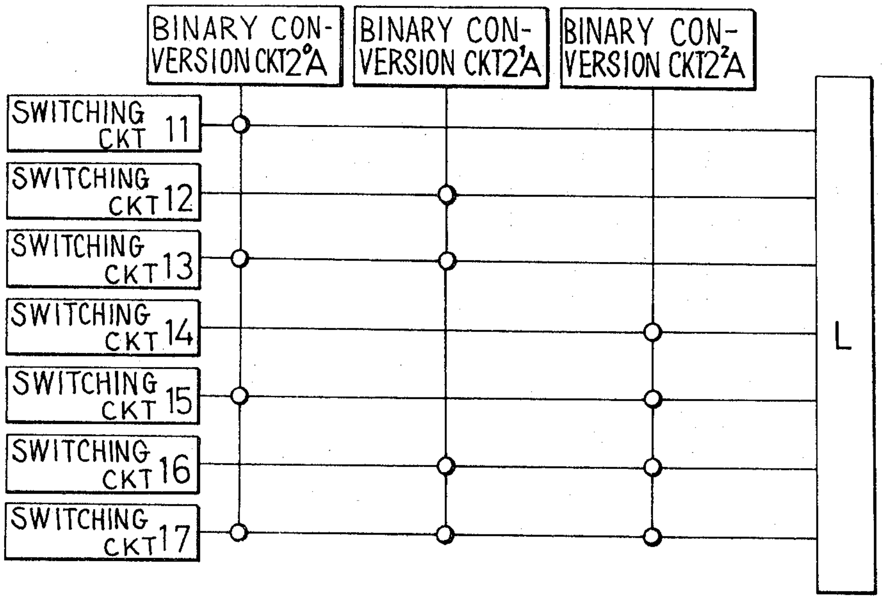
FIGS. 9 and 10 are a view illustrating the principle of a circuit according to the present invention.
Figure 10:
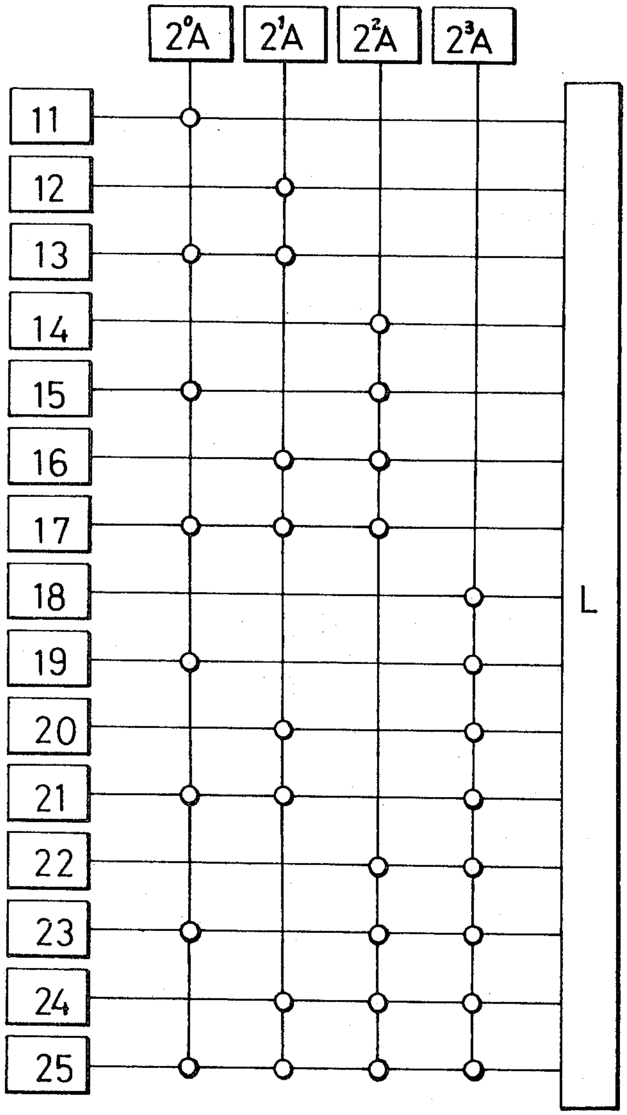

For example, when seven decimal codes are to be converted into binary codes, seven switching circuits 11, 12, ——, and 17 may be connected to three binary conversion circuits $2^0$A, $2^1$A and $2^2$A as shown in FIG. 9. Furthermore, when fifteen decimal codes are to be converted into binary codes, fifteen switching circuits 11, 12, ——, and 25 may be connected to four binary conversion circuits $2^0$A, $2^1$A, $2^2$A and $2^3$A as shown in FIG. 10.

Generally speaking, since the binary coded signals should be gennerated from the binary conversion circuits in different combinations, the switching circuits should be connected to the binary conversion circuits in different combinations. Accordingly, the switching circuits can be provided in the number corresponding to the maximum number or different combinations of the binary conversion circuits. If all switching circuits can be connected to the binary conversion circuits which are all in different combinations even though the number of binary conversion circuits to be connected to the switching circuits is one less than the number of the switching circuits, one binary conversion circuit is not required and therefore the number of switching circuits should be more than the maximum number of different combinations of binary conversion circuits.

The relationship between the number of switching circuits and that of binary conversion circuits is given with the equation below, $2^n - 1 < m \leq 2(n+1) - 1$ Where, $n - 1$: the number of binary conversion circuits *m:* the number of switching circuits However, if $n = 1$, that is, the number of binary conversion circuits is two, the number of switching circuits should be three as known from the embodiment shown in the foregoing.

If the circuit according to the present invention is arranged according to the formula for combination, different binary coded singlas can be generated corresponding to the switches, that is, the switching circuits, and the binary conversion circuits can be limited to the minimum number.

In the circuit of the embodiment described above, a plural number of binary conversion circuits may operate simultaneously when a certain switch is operated. In this case, the current flowing in emitter resistor Re increases and the emitter potential rises. When the potential of the emitter thus varies, the switching operation of each switch becomes inaccurate. Accordingly, the switches should be respectively compensated for accurate switching operation but the design of the circuit for this compensating means and assembly are difficult.

In the embodiment described below, emitter resistor Re is parallel-connected to a non-linear element to reduce fluctuation of the voltage across both terminals of emitter resistor Re.

As non-linear element CE, a diode, diode or transistor with Zener characteristic or varistor can be employed.

Figure 11:
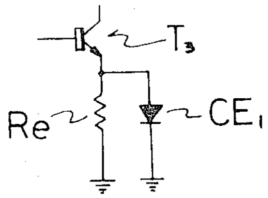
FIGS. 11, 13, 14 and 15 are partial circuit diagrams illustrating another embodiment of a circuit according to the present invention.

Referring to FIG. 11, there is shown part of the circuit according to the present invention when diode $CE_1$ is employed as said non-linearity device.

Figure 12:
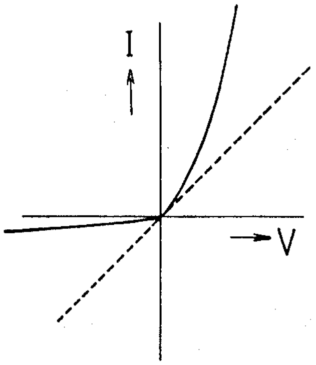
FIG. 12 is a graph illustrating the characteristic of diode $CE_1$ to be employed in the circuit shown in FIG. 11.

Diode $CE_1$ is connected in the forward direction of the emitter current. Generally, the diode shows the non-linearity that current I suddenly increases in accordance with increase of voltage V as shown with a solid line in FIG. 12. On the other hand, a fixed resistor has the linearity as shown with a broken line in FIG. 12. Accordingly, even though the current flowing in the diode in the forward direction increases, the increase of the voltage in the diode is less than that in a fixed resistor.

As described above, the fluctuation of the emitter potential can ge reduced by connecting emitter resistor Re in parallel with diode $CE_1$.

In this case, the value of the emitter potential is comparatively small, for example, 0.3 to 0.5V due to the characteristic of a diode.

Figure 13:
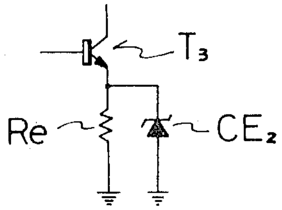

Referring to FIG. 13, there is shown a part of the circuit according to the present invention in which Zener diode $CE_2$ is employed as said non-linearity device. Zener diode $CE_2$ is connected in the reverse direction to the emitter current; accordingly, the emitter potential is almost constantly held at a comparatively high potential, for example, at approximately 3 to 12V due to the characteristic of a Zener diode.

Figure 14:
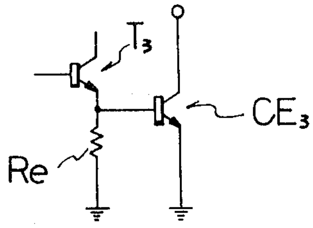

Referring to FIG. 14, there is shown a part of the circuit according to the present invention in which transistor $CE_3$ is employed as said non-linear element. The base of transistor $CE_3$ is grounded, thereby the emitter potential of transistor $T_3$ is held at an almost fixed value due to Zener characteristic between the base and the emitter of transistor $CE_3$.

Figure 15:
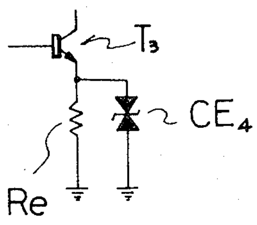

Referring to FIG. 15, there is shown a circuit according to the present invention in which varistor $CE_4$ is employed as said non-linear element. In this case, the direction of connection can be freely determined.

The fluctuation of the operation potential of the entire circuit depending on the number of operating transistors can be reduced by connecting non-linear element CE in parallel with emitter resistor Re as described above. In this case, accordingly, the circuit according to the present invention is advantageous because the switching operation of the circuit shows little change in operation accuracy and the circuit can maintain almost the same operating condition with a variation of temperature.

When it is necessary to obtain the pulse signal synchronized with the switches in the circuit of the embodiment described above, the circuit can be arranged as described below.

Figure 16:
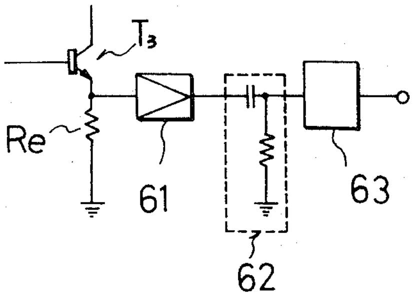
FIG. 16 is a circuit diagram illustrating another embodiment of the present invention.

Referring to FIG. 16, there is shown a circuit according to the present invention, wherein amplifier 61, differentiating circuit 62 and flip-flop circuit 63 are series-connected to emitter 13e of transistor $T_3$ of a circuit shown in FIG. 3.

Figure 17:
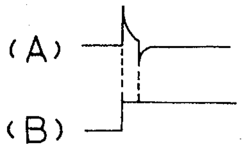
FIG. 17 is a graph illustrating a voltage waveform of the circuit shown in FIG. 16.

Amplifier 61 amplifies the trigger waveforms generated across both terminals of emitter resistor Re of transistor $T_3$ and differential circuit 62 differentiates the amplified trigger waveforms. As shown in FIG. 17 (A), the differential waveform synchronized with the operation of the switch is supplied to flip-flop circuit 63 and the pulse shown in FIG. 17 (B) is generated from the output terminal of the flip-flop circuit.

This circuit, as described above, can be used when the pulses are required as the strobe signal for generating the pulse synchronized with the operation of the switch and shifting the binary coded signals.

The circuit according to the present invention is as described above and is advantageous as follows.

Since the decimal codes are directly converted into binary codes by combinations of switching circuits and binary conversion circuits, the circuit arrangement is far simpler than the conventional type circuit. If the circuit is formed with the integrated circuits such as IC, LSI, etc., the number of terminals is extremely small and wiring is easy.

The device for setting the base potential of each switching circuit and each series circuit of the fixed bias resistance are parallel-connected and are connected to common current limiting resistor Ro, and the impedance of the series circuit is far smaller than the resistance value of the current limiting resistor; therefore, the entire impedance does not nearly vary even though the resistance value of one device varies. Accordingly, the bias potential which determines the operation potential of the transistor is stable.

Since the modified Schmitt circuit can be formed with the switching circuits and binary conversion circuits, conversion from decimal codes into binary codes and waveform formation can be performed at the same time and therefore the output signal waveform can be set as a waveform having a small duration. The modified Schmitt circuit can be used as the input device of the circuit which operates quickly such as the TTL.

Furthermore, since the non-linear element can be connected in parallel with the common emitter resistor, the bias potential of each circuit can be stabilized even when the switching circuits and a plurality of binary conversion circuits operate simultaneously and accordingly the operation of the circuits can be ensured.

What is claimed is:

1. A decimal to binary code conversion circuit comprising:

*a.* a plurality of switching circuit means, each switchingf circuit means including contactless type variable resistance means, and a first switching element having a first reference electrode wherein the output voltage of said switching circuit means varies in accordance with the variation of resistance of said variable resistance means;

*b.* a plurality of binary conversion circuit means, each conversion circuit means including a second switching element having a second reference electrode, the input of each said second switching element being coupled to the output of at least one of said first switching elements and wherein the first reference electrode of all of said first switching elements and the second reference electrodes of all of said second switching elements are connected in parallel;

*c.* means for maintaining the voltage of all of said first and second reference electrodes within a predetermined range, whereby predetermined binary signals are generated by at least one of said binary conversion circuit means in response to the actuation of one of said variable resistance means.

2. A decimal-to-binary code conversion circuit according to claim 1 wherein said means for maintaining the voltage is a resistor and wherein said first switching element, said second switching element and said resistor form a Schmitt trigger circuit.

3. A decimal-to-binary code conversion circuit according to claim 2, wherein at least one non-linear element is parallel-connected to said resistor.

4. A decimal-to-binary code conversion circuit according to claim 2 wherein: $2^n - < m \leq 2^{(n+1)} - 1$ where:

n + 1 = the number of said binary conversion circuit means m= the number of switching circuit means

5. A decimal-to-binary code conversion circuit according to claim 1 wherein said variable resistance means is a magneto-resistance effect deivce.

6. A decimal-to-binary code conversion circuit according to claim 1 wherein said variable resistance means is a semiconductor photoelectric effect device.

7. A decimal-to-binary code conversion circuit according to claim 1 wherein said variable resistance means is a pressure sensitive device.

8. A decimal to binary code conversion circuit according to claim 1 wherein said variable resistance means is a semiconductor pressure sensitive device.

9. A decimal-to-binary code conversion device according to claim 1 wherein said pressure sensitive device comprises a conductive rubber.

10. A decimal-to-binary coder conversion device according to claim 1 wherein said first and second switching elements are transistors.

11. A decimal-to-binary code conversion circuit according to claim 3, wherein the non-linear element is a diode and is connected in the forward direction in reference to the reference electrode current.

12. A decimal-to-binary code conversion circuit according to claim 3, wherein the non-linear element is a Zener diode and is connected in a reverse direction in reference to the reference electrode current.

13. A decimal-to-binary code conversion circuit according to claim 3, wherein said non-linear element is a transistor and the base of said transistor is connected to said reference electrode.

14. A decimal-to-binary code conversion circuit according to claim 3 wherein said non-linear element is a varistor.

15. A decimal-to-binary code conversion circuit according to claim 2, further including a differentiating circuit which differentiates the wave-form of voltage generated across said resistor and a flip-flop circuit which operates according to a differentiated voltage waveform.

* * * * *